United States Patent
Su et al.

(10) Patent No.: US 8,692,128 B2
(45) Date of Patent: Apr. 8, 2014

(54) PRINTED CIRCUIT BOARD WITH GOOD PERFORMANCE ON IMPEDANCE

(75) Inventors: Ping-Sheng Su, New Taipei (TW); Jun Chen, Kunshan (CN); Feng-Jun Qi, Kunshan (CN); Qing Wang, Kunshan (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/290,149

(22) Filed: Nov. 7, 2011

(65) Prior Publication Data

US 2012/0111626 A1  May 10, 2012

(30) Foreign Application Priority Data

Nov. 5, 2010 (CN) .......................... 2010 1 0533114

(51) Int. Cl.
*H05K 1/03* (2006.01)
(52) U.S. Cl.
USPC .......................................... 174/255; 174/261
(58) Field of Classification Search
USPC .......... 174/255, 260, 261; 361/760, 792, 795; 333/32, 33, 34, 124, 238
See application file for complete search history.

(56) References Cited

U.S. PATENT DOCUMENTS

| 5,952,709 | A | 9/1999 | Kitazawa et al. | |
| 6,229,095 | B1 * | 5/2001 | Kobayashi | 174/255 |
| 6,674,174 | B2 * | 1/2004 | Chungpaiboonpatana et al. | 257/778 |
| 7,202,758 | B2 * | 4/2007 | Hsu | 333/33 |
| 7,385,459 | B2 * | 6/2008 | Duan et al. | 333/33 |
| 8,138,857 | B2 * | 3/2012 | Ding et al. | 333/161 |
| 8,248,183 | B2 * | 8/2012 | Syal | 333/33 |
| 2002/0162685 | A1 | 11/2002 | Cotro et al. | |
| 2005/0237126 | A1 * | 10/2005 | Babb et al. | 333/34 |

FOREIGN PATENT DOCUMENTS

| CN | 101472388 | 7/2009 |
| TW | 583897 | 4/2004 |

* cited by examiner

*Primary Examiner* — Boris L. Chervinsky
*Assistant Examiner* — Pete Lee
(74) *Attorney, Agent, or Firm* — Wei Te Chung; Ming Chieh Chang

(57) ABSTRACT

A printed circuit board, comprises an insulative substrate, a grounding layer located on a surface of the insulative substrate and defining a through slot, a plurality of conductive pins located on an outer surface of the printed circuit board; and a fence layer located between the conductive path and the grounding layer. Each conductive pin defines at least a soldering portion. The soldering portion is alignment to the through slot along a vertical direction.

3 Claims, 3 Drawing Sheets

PRINTED CIRCUIT BOARD WITH GOOD PERFORMANCE ON IMPEDANCE

FIELD OF THE INVENTION

The present invention relates to a printed circuit board, and more particularly to a printed circuit board assembled in an electrical connector.

DESCRIPTION OF PRIOR ART

For improving the signal transmission rate of an electrical connector and extensively applying the high-frequency circuits, the requirement of a printed circuit board assembled in the electrical connector is better and better. The circuit performance which is provided by the printed circuit board must be able to make the signal transmission not occur in the phenomenon of reflection, to maintain signal integrity, to reduce transmission loss and to play a role of matching the impedance. Thus, the transmission signal is complete, reliable, accurate, non-interference and noise-free. The printed circuit board which is used in the high-frequency electrical connector generally has several material layers together. The traditional printed circuit board includes an insulative substrate, a grounding layer, a fence layer, and a conductive path made of copper material and located on the outermost thereof. The characteristic impedance of the printed circuit board is determined under the conditions of the width of the conductive path, the thickness of the copper material, the thickness and the dielectric coefficient of the insulative substrate, etc. However, the conductive path is soldered on a terminal of the electrical connector to form a large solder joint and broaden the width of the conductive path, so that the characteristic impedance becomes smaller and the electrical connector having the printed circuit board can not achieve the corresponding association requirement.

As discussed above, an improved printed circuit board overcoming the shortages of existing technology is needed.

SUMMARY OF THE INVENTION

Accordingly, an object of the present invention is to provide a printed circuit board with good performance on impedance.

In order to achieve the above-mentioned objects, a printed circuit board, comprises an insulative substrate, a grounding layer located on a surface of the insulative substrate and defining a through slot, a plurality of conductive pins located on an outer surface of the printed circuit board, and a fence layer located between the conductive path and the grounding layer. Each conductive pin defines at least a soldering portion. The soldering portion is alignment to the through slot along a vertical direction.

Other objects, features and advantages of the invention will be apparent from the following detailed description taken in connection with the accompanying drawings.

DETAILED DESCRIPTION OF PREFERRED EMBODIMENTS

Figure 1:
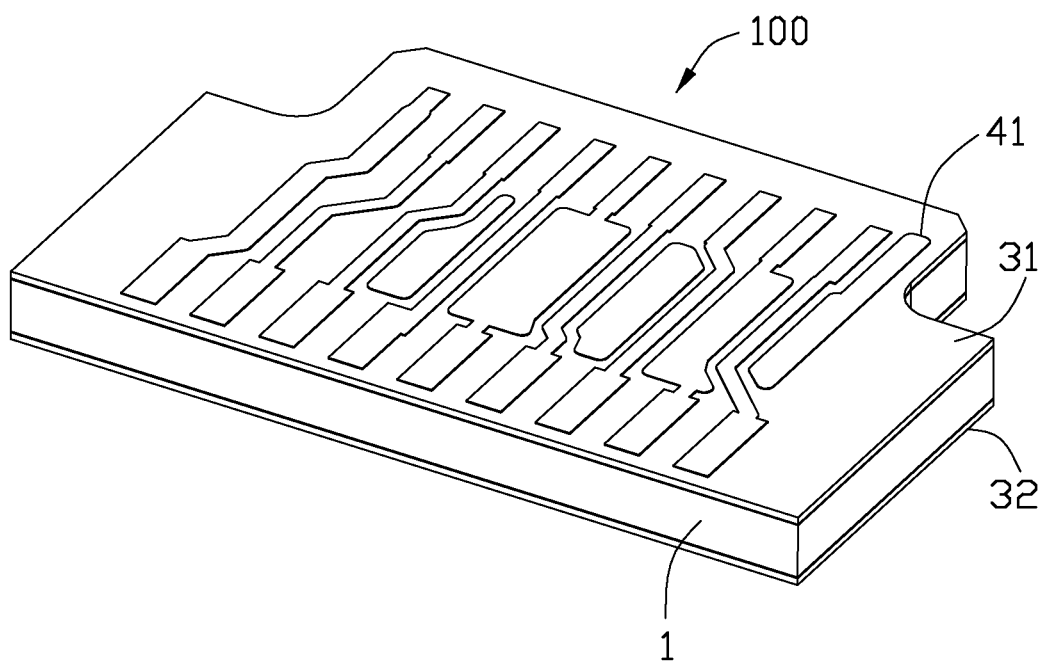
FIG. 1 is a perspective view of a printed circuit board in accordance with the present invention.

Reference will now be made to the drawing figures to describe the present invention in detail.

Figure 2:
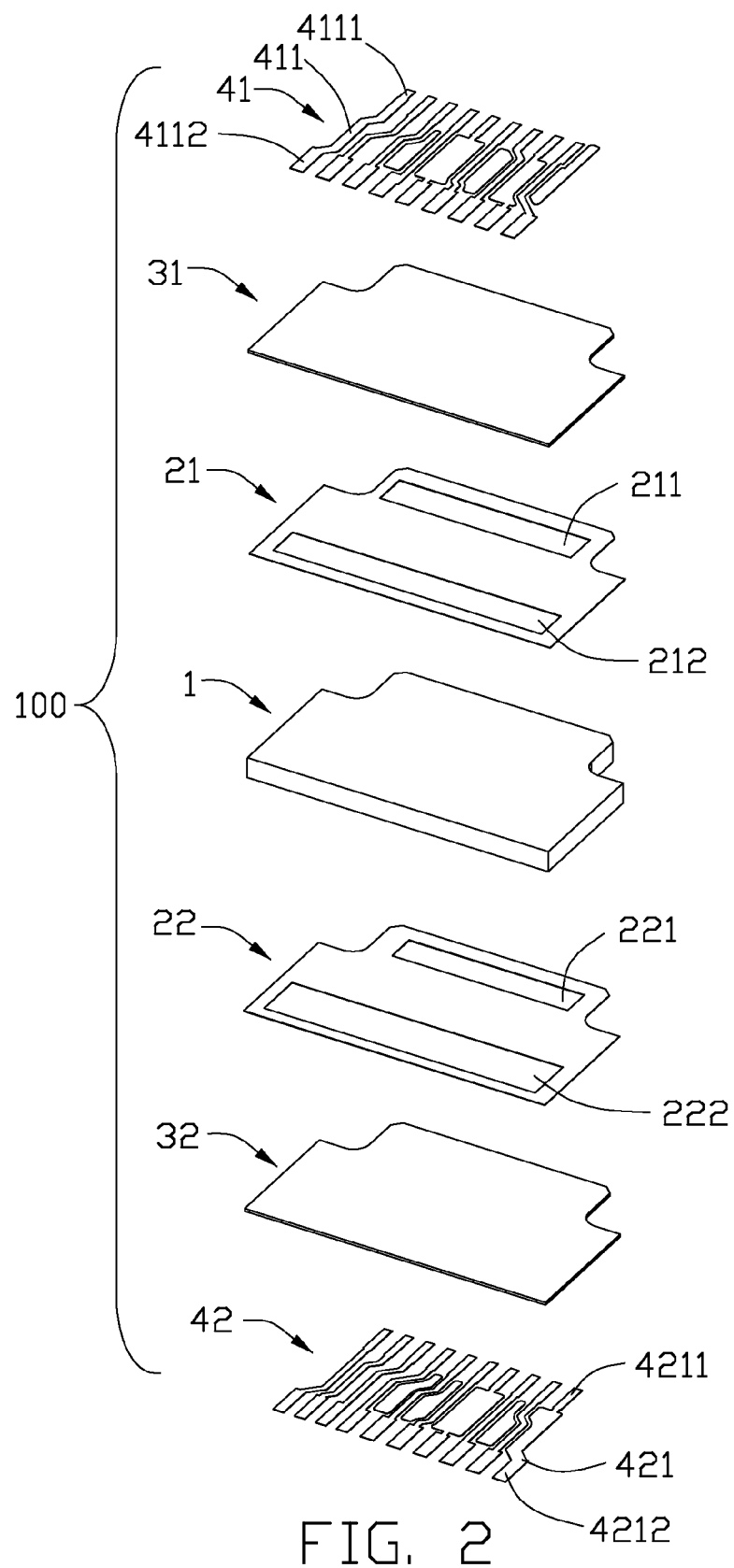
FIG. 2 is a explored, perspective view of the printed circuit board shown in FIG. 1.
Figure 3:
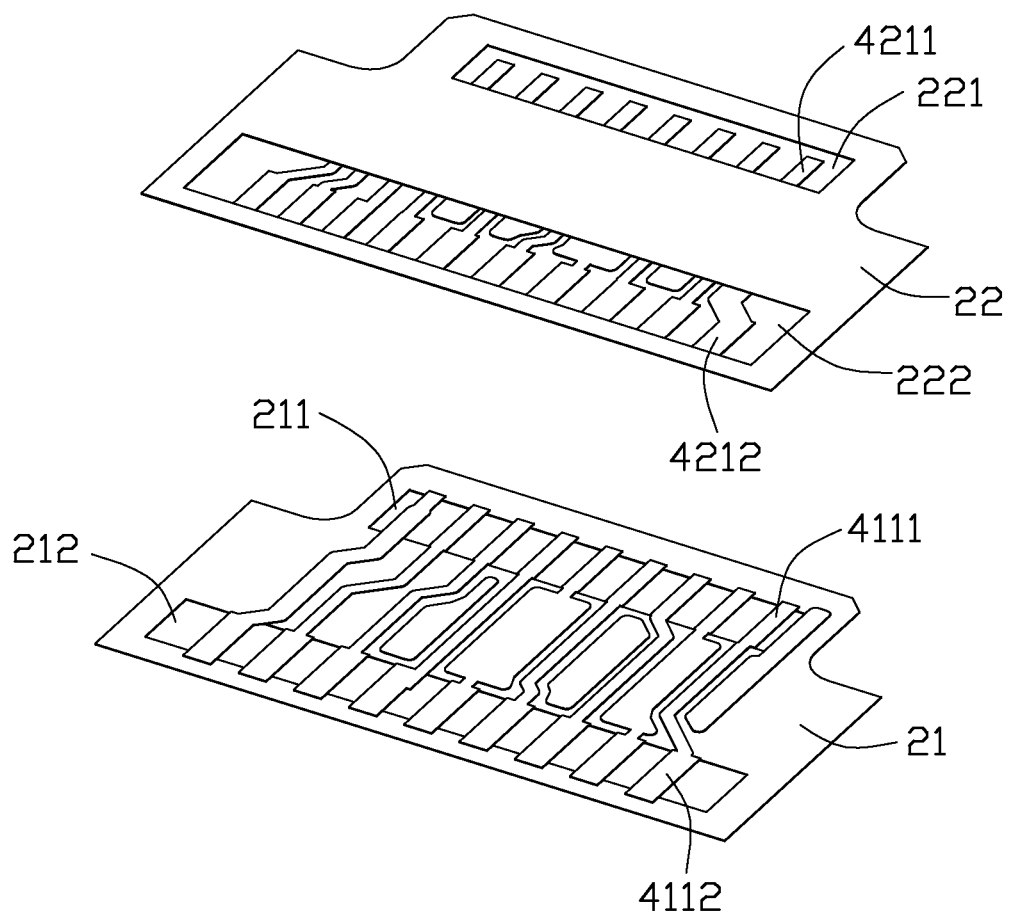
FIG. 3 is a partly assembled, perspective view of the printed circuit board shown in FIG. 2.

Referring to FIGS. 1 to 3, a printed circuit board 100 in accordance with the present invention comprises an insulative substrate 1, a first grounding layer 21 located on a surface of the insulative substrate 1, a second grounding layer 22 located on another surface of the insulative substrate 1, a first fence layer 31 located on a surface of the first grounding layer 21, a second fence layer 32 located on another surface of the second grounding layer 22, a first conductive path 41 located on a surface of the first fence layer 31 and a second conductive path 42 located on another surface of the second fence layer 32.

The first grounding layer 21 comprises a first through slot 211 located on the front thereof and a second through slot 212 located on the rear thereof. The second grounding layer 22 comprises a first through slot 221 located on the front thereof and a second through slot 222 located on the rear thereof. The first fence layer 31 is located between the first grounding layer 21 and the first conducts path 41. The second fence layer 32 is located between the second grounding layer 22 and the second conducts path 42. The first conductive path 41 and the second conductive path 42 respectively located on the upper surface and the lower surface of the printed circuit board 100. The grounding layer 21, 22 are made of copper material which is printed on the insulative substrate 1.

The first conductive path 41 has a plurality of first conductive pins 411. The first conductive pin 411 comprises a first soldering portion 4111 located on the front thereof and a second soldering portion 4112 located on the rear thereof. The first soldering portions 4111 are arranged in a row along a horizontal direction, and the second soldering portions 4112 are arranged in a row along the horizontal direction. The second conductive path 42 has a plurality of second conductive pins 421. The second conductive pin 421 comprises a first soldering portion 4211 located on the front thereof and a second soldering portion 4212 located on the rear thereof. The first soldering portions 4211 are arranged in a row along the horizontal direction, and the second soldering portions 4212 are arranged in a row along the horizontal direction.

Referring to the FIG. 3, the first soldering portion 4111 and the second soldering portion 4112 of the first conductive pin 41 are alignment to the first through slot 211 and the second through slot 212 of the first grounding layer 21 along a vertical direction, respectively. The first soldering portion 4211 and the second soldering portion 4212 of the second conductive pin 42 are alignment to the first through slot 221 and the second through slot 222 of the second grounding layer 22 along the vertical direction, respectively. Under the method, it can reduce the capacitance between the grounding layer and the conductive path for improving the impedances of the printed circuit board 100 and a correspondence connector.

The first conductive path 41 and the second conductive path 42 are respectively made of copper or other metal material which is printed on the first fence layer 31 and the second fence layer 32. The first through slots 211, 221 and the second through slots 212, 222 are of rectangular or other shapes, and have a plurality of tiny through slots.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A printed circuit board comprising:

an insulative substrate; a grounding layer coated upon the substrate and defining empty areas; a plurality of conductive traces formed upon an exterior surface of the printed circuit board and defining corresponding soldering portions thereof, respectively; and a dielectric fence layer disposed between the grounding layer and the conductive traces in a vertical direction perpendicular to said printed circuit board; wherein the empty areas are aligned with the corresponding soldering portions in the vertical direction, respectively; wherein each of said conductive traces defines two opposite soldering portions in a front-to-back direction perpendicular to said vertical direction; wherein said empty areas are unified together to form two through slots each extending along a transverse direction perpendicular to said vertical direction and said front-to-back direction; wherein a dimension of each of the through slot in the transverse direction is compliant with a corresponding region in which the soldering portions span in the transverse direction.

2. The printed circuit board as claimed in claim 1, wherein one of said through slot is larger than the other in said transverse direction.

3. The printed circuit board as claimed in claim 1, wherein said insulative substrate defines opposite first and second surfaces, and said grounding layer, said fence layer and said conductive traces totally being a first set combination are located upon the first surface, and a second set combination of the grounding layer, the fence layer and the conductive traces is located on the second surface in a symmetrical manner with regard to the first set combination in the vertical direction.

* * * * *